United States Patent
Henrie

(10) Patent No.: US 9,041,610 B1
(45) Date of Patent: May 26, 2015

(54) DYNAMIC ANTENNA PATTERN MEASUREMENT METHOD

(71) Applicant: The United States of America as Represented by the Secretary of the Navy, Washington, DC (US)

(72) Inventor: Justin Henrie, Camarillo, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 389 days.

(21) Appl. No.: 13/691,299

(22) Filed: Nov. 30, 2012

Related U.S. Application Data

(63) Continuation-in-part of application No. 12/770,311, filed on Apr. 29, 2010, now Pat. No. 8,325,098.

(51) Int. Cl.
*G01R 29/10* (2006.01)

(52) U.S. Cl.
CPC ..................................... *G01R 29/10* (2013.01)

(58) Field of Classification Search
USPC ................................................ 343/703, 760
See application file for complete search history.

(56) References Cited

U.S. PATENT DOCUMENTS

| 8,325,098 | B1* | 12/2012 | Henrie | 343/703 |
| 8,531,343 | B1* | 9/2013 | Henrie | 343/703 |
| 2004/0155824 | A1* | 8/2004 | Nagashima | 343/703 |

OTHER PUBLICATIONS

Henrie, Justin, et al., Measurement of Time-Evolving Electronically Steerable Radiation Patterns at Fast . . . , Microwave Symposium Digest (MTT), Jun. 2011, p. 1-4, Baltimore, MD, 2011.

Henrie, Justin, et al., Measurement of Time-Evolving Electronically Steerable Radiation Patterns at Fast . . . , Slide Set presented at Microwave Symposium Digest, Jun. 2011, US, 2011.

\* cited by examiner

*Primary Examiner* — Hoang V Nguyen
*Assistant Examiner* — Hai Tran
(74) *Attorney, Agent, or Firm* — Christopher L. Blackburn

(57) ABSTRACT

A dynamic antenna pattern measurement method. Embodiments of the invention provide for nanosecond or better time resolution and milliradian angular resolution of the dynamic radiation pattern of an antenna under test over the predetermined solid angle scan (up to 4 π steradians) of the dynamic radiation pattern.

10 Claims, 4 Drawing Sheets

DYNAMIC ANTENNA PATTERN MEASUREMENT METHOD

CROSS-REFERENCE TO RELATED APPLICATIONS

This application is being filed as a continuation in part application off of previously filed application having Ser. No. 12/770,311 filed on Apr. 29, 2010 the entire disclosure of which is incorporated herein.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to antenna pattern measurement methods.

BRIEF DESCRIPTION OF THE DRAWINGS

Thus, FIGS. 2A, 2B, & 2C illustrate three positions for embodiments of the invention having a probe antenna and a reference antenna in an orientation in relation to an antenna under test.

It is to be understood that the foregoing and the following detailed description are exemplary and explanatory only and are not to be viewed as being restrictive of the invention, as claimed. Advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

Embodiments of the invention generally relate to a dynamic antenna pattern measurement method. Embodiments of the invention provide for nanosecond or better time resolution and milliradian angular resolution of the dynamic radiation pattern of an antenna under test 202 (FIGS. 2A-C) over a predetermined solid angle scan (up to 4 π steradians) of the dynamic radiation pattern. The method provides for a direct measurement of the dynamic radiation of an antenna, and does not suffer the limiting simplifications of linearity, grid resolution, material properties, physical mechanisms, and geometry which are inherent in time-domain electromagnetic simulation packages such as Remcon's XFDTD and CST Microwave Studio.

Figure 1A:
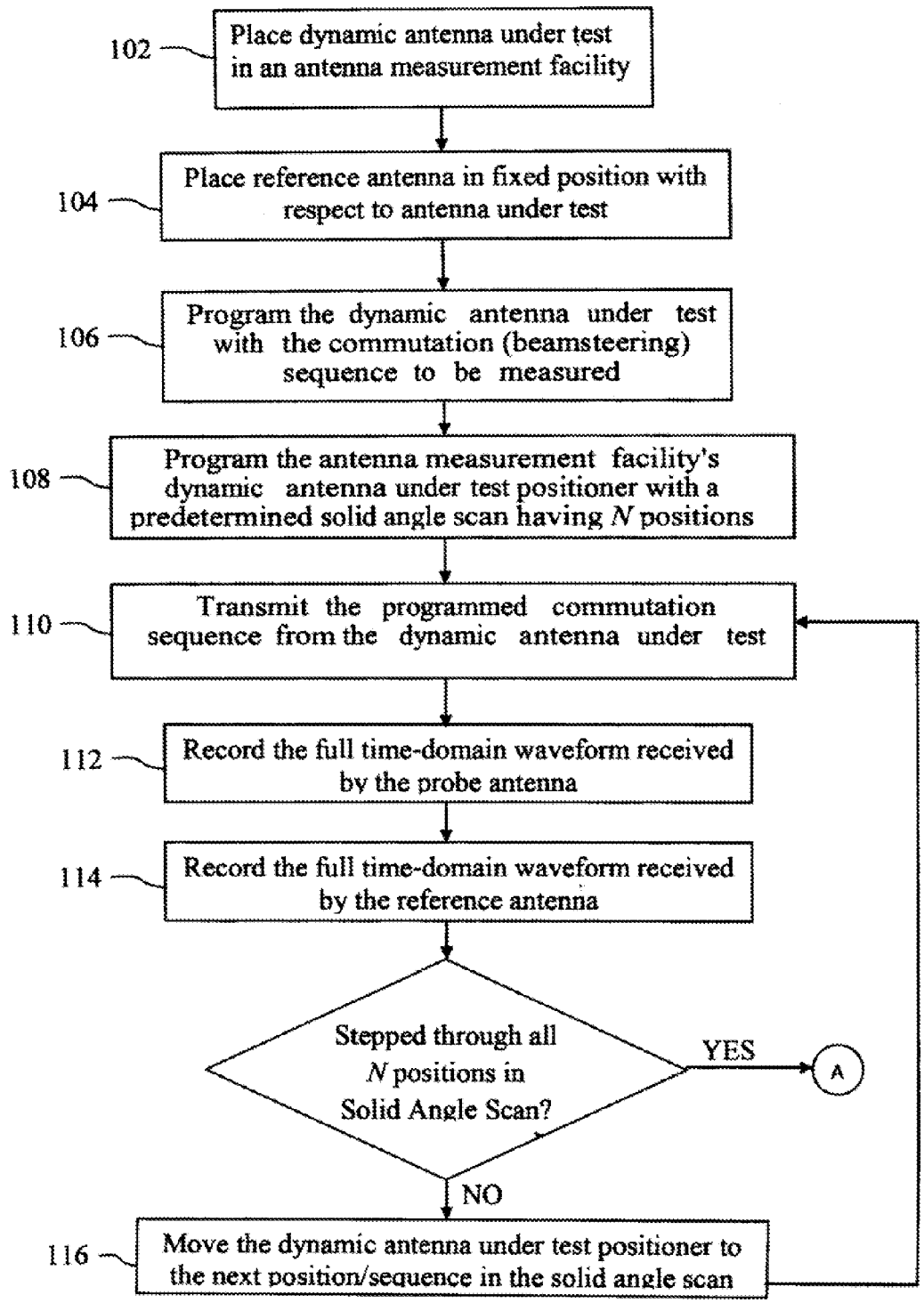
FIGS. 1A and 1B combine to form a flowchart describing an iterative method of recovering the full vector angular and temporal information of one output commutation sequence's radiation.
Figure 1B:
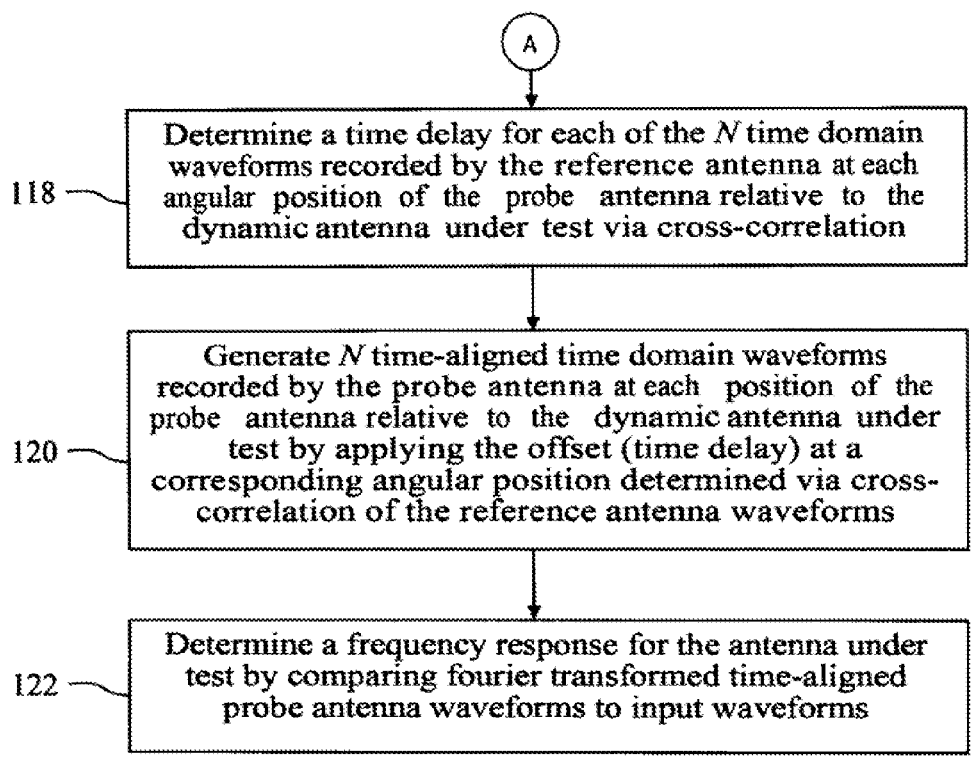

An embodiment of a dynamic antenna pattern measurement method performed in accordance with the principles of the invention includes recovering the full vector angular and temporal information of one output commutation sequence's radiation from the recorded full time-domain waveforms (of the probe antenna and reference antenna), resulting in a full vector solid-angle measurement of the dynamic antenna under test's commutation sequence providing for nanosecond or better time resolution and miliradian angular resolution over the predetermined solid angle scan of the dynamic radiation pattern of said AUT by performing the steps in FIGS. 1A-1B.

Figure 2A:
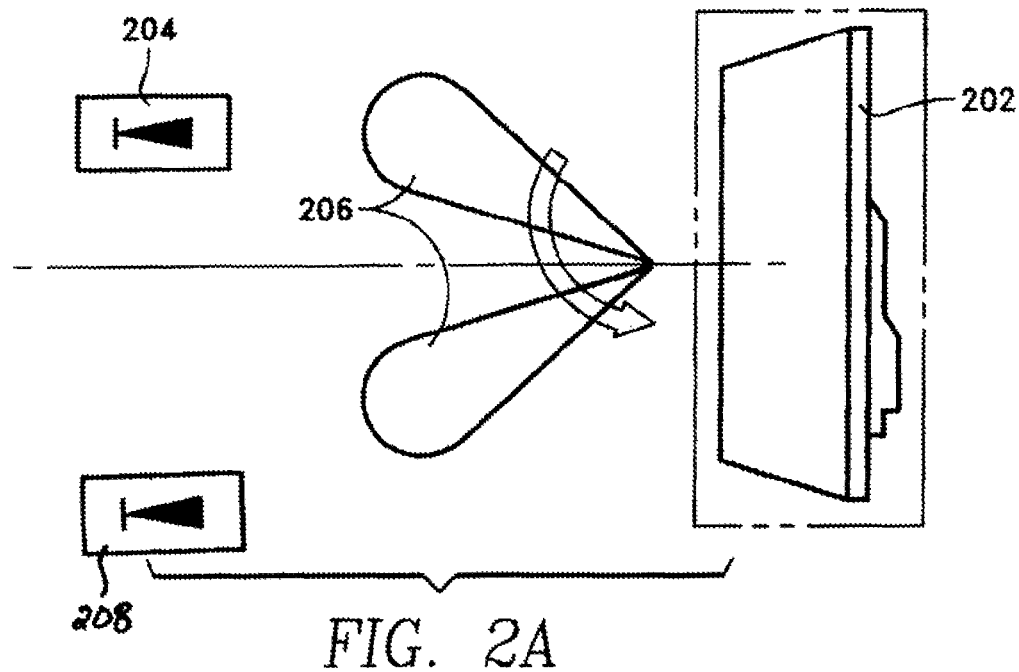
FIG. 2A depicts a probe antenna and reference antenna in an orientation in relation to an antenna under test in accordance with principles of the invention. The probe antenna is at a first exemplary angular position relative to the dynamic antenna under test.
Figure 2B:
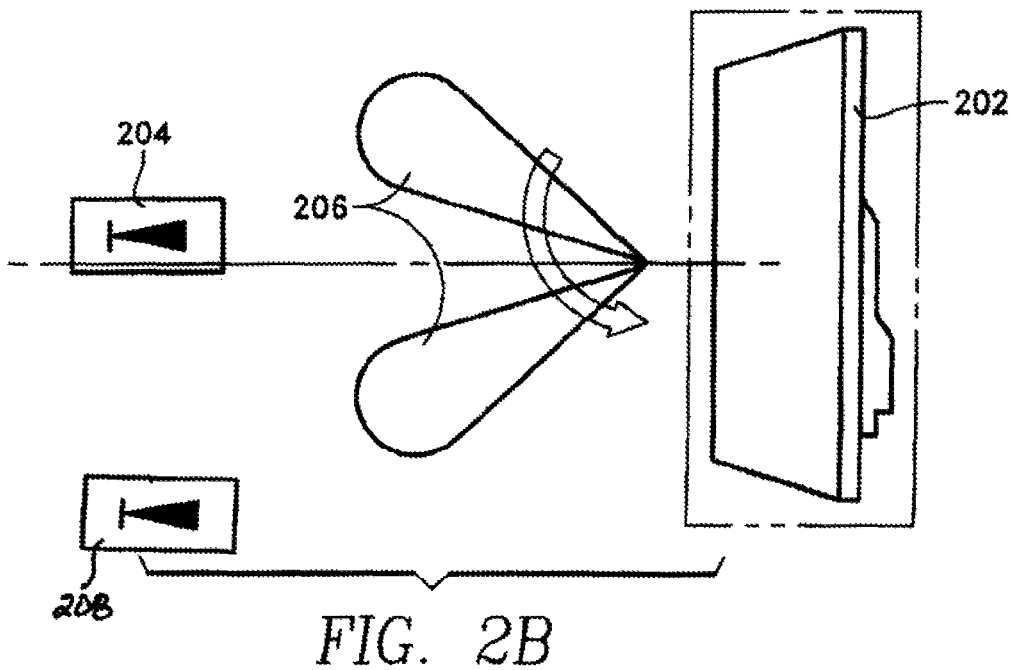
FIG. 2B depicts a probe antenna and reference in an orientation in relation to an antenna under test in accordance with principles of the invention. The probe antenna is at second exemplary first angular position relative to the dynamic antenna under test.
Figure 2C:
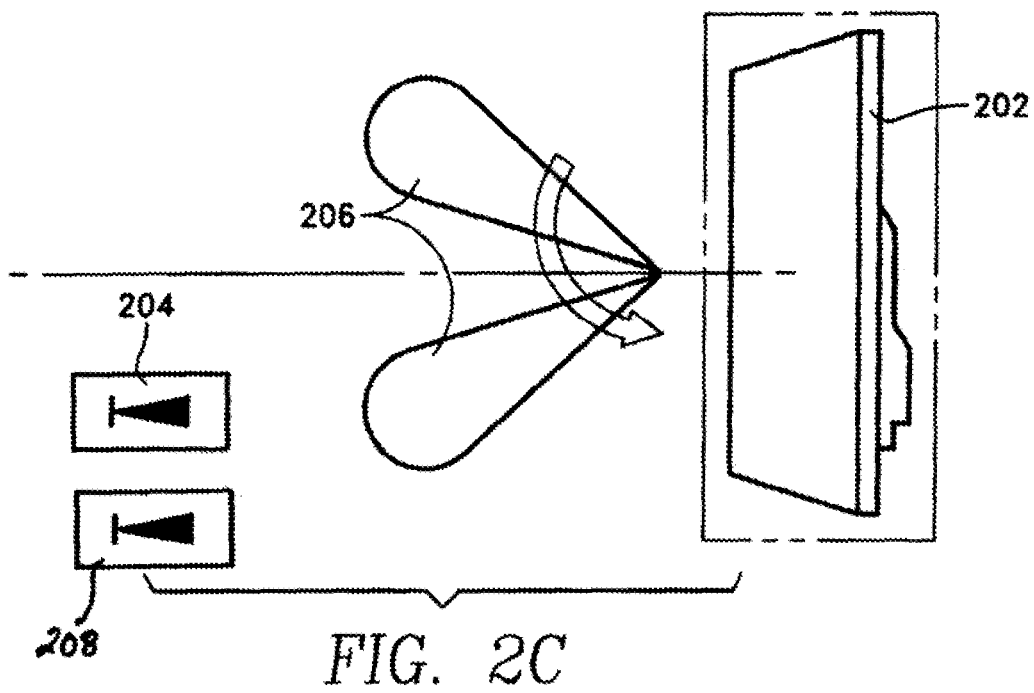
FIG. 2C depicts a probe antenna and reference antenna in an orientation in relation to an antenna under test in accordance with principles of the invention. The probe antenna is at third exemplary first angular position relative to the dynamic antenna under test.

Beginning with step 102 in FIG. 1A, a dynamic antenna under test is placed in an antenna measurement facility. With reference to FIGS. 2A-C a dynamic antenna under test ("AUT") 202 is a dynamic antenna that is tested using a process in accordance with the principles of this invention. A dynamic antenna is any antenna capable of changing its radiation characteristics (e.g., directionality, gain) by electronic means. A popular example of a dynamic antenna is a phased array antenna. The antenna measurement facility includes a probe antenna 204 and can be any facility that has antenna positioning hardware and a digitizing receiver attached to the probe antenna 204 and reference antenna 208. The antenna radiation received at the antennas is recorded on the digitizing receiver (or other digital media) and provided to an electronic processor (including a processing unit in communication with electronic memory holding data and program instructions) for processing the recorded waveforms according to program instructions that implement the processing steps described herein.

A "probe antenna" 204 is any antenna whose received radiation pattern characteristics are known and are suitable to antenna measurement testing. The bandwidth of the probe antenna's 204 receiver should be greater than or equal to the bandwidth of the modulation of the AUT's 202 output radiation 206.

With reference to FIG. 1A, method embodiments include placing a reference antenna at a fixed position relative to the AUT. With reference to FIGS. 2A-C, a "reference antenna" 208 is any antenna whose received radiation pattern characteristics are known and are suitable to antenna measurement testing. The bandwidth of the reference antenna's 208 digitizing receiver should be greater than or equal to the bandwidth of the modulation of the AUT's 202 output radiation 206.

With reference to FIG. 1A, method embodiments include programming the AUT with the commutation (beamsteering) sequence to be measured 106. Any sequence can be used, subject to the facility's power handling capabilities, receiver bandwith, and wide-angle radiation measurement capability. There is no inherent limitation to the angular, bandwidth, amplitude, or frequency range of the commutation sequence due to the proposed measurement method (though limitations may be imposed by the capabilities of the hardware used to implement the method).

With reference to FIG. 1A, the antenna measurement facility's positioner ("positioner") is programmed with the desired solid angle scan 108. With reference to FIGS. 2A-C, the positioner is used to step through the solid angle scan by positioning the AUT 202 at N "angular positions" relative to the probe antenna 204, or vice versa (where the set of N angular positions defines the spatial sampling grid over the solid angle scan). The desired solid angle scan can be any shape, including, for example, spherical, planar, and cylindrical, and can be any extent, including, for example, full sphere or half sphere.

With the positioner in an initial position, the desired commutation sequence is transmitted from the AUT 202. This step is depicted as block 110 in FIG. 1A.

With reference to FIGS. 2A-C, the full time-domain waveform ("waveform") received by the probe antenna 204 is recorded on any known form of digital media ("digital media" including, for example, computer memory). This step is depicted as block 112 in FIG. 1A.

With reference to FIGS. 2A-C, the full time-domain waveform ("waveform") received by the reference antenna 208 is recorded on any known form of digital media ("digital media" including, for example, computer memory). This step is depicted as block 114 in FIG. 1A.

With reference to the loop in FIG. 1A, the following steps are iterated through until the entire solid angle scan desired is completed, i.e., the receiver has stepped through the entire spatial area of interest: 1) moving the positioner to the next sequence in the solid angle scan 116; 2) re-playing the AUT's commutation sequence 110; 3) recording the full time-domain waveform received by the probe antenna 112; and 4) recording the full time-domain waveform received by the reference antenna 114.

Each of the full time-domain waveforms recorded by the probe antenna is referred to herein using $P_n(t)$, where N is the number of angular positions of the spatial sampling grid through which the positioner steps during the solid angle scan, n is an index from 1 to N that associates the probe antenna time domain waveform to the position of the probe antenna relative to the AUT at which the probe antenna time domain waveform was recorded, and t represents the time variable and is correlated to the time of the input signal. For example $P_1(t)$ is the full time-domain waveform recorded by the probe antenna at the first angular position of the AUT relative to the probe antenna in the solid angle scan.

Each of the full time-domain waveforms recorded by the reference antenna is referred to herein using the notation $R_n(t)$, where N is the number of angular positions of the spatial sampling grid through which the positioner steps during the solid angle scan, n is an index from 1 to N that associates the reference antenna time domain waveform to the position of the probe antenna relative to the AUT at which the reference antenna time domain waveform was recorded, where again t represents time. For example $R_1(t)$ is the full time-domain waveform recorded by the reference antenna at the first angular position of the AUT relative to the probe antenna in the solid angle scan.

With reference to FIG. 1B, the full time-domain waveforms recorded by the reference antenna at each of the N angular positions of the probe antenna relative to the AUT (except for the time-domain waveform recorded at the angular position of the center/reference waveform) are cross correlated to generate a delay or offset relative to an arbitrarily selected full time-domain waveform recorded by the reference antenna $R_{n=a}(t)$, where a represents the index of the reference antenna waveform that serves as the center/reference waveform 118.

A time delay τ for each angular position n from 1 to N is generated using the cross-correlation function for the angular position as mathematically described in Equation 1. Cross-correlations are useful for determining the time delay between two like/similar signals. The maximum (or minimum if the signals are negatively correlated) of the cross-correlation function indicates the point in time where the signals are best aligned, i.e. the time delay τ between two cross-correlated signals is determined by the argument of the maximum, or arg max of the cross-correlation, $$\tau_n = \begin{cases} \underset{t}{\operatorname{argmax}}((R_n * R_a)(t)), & n \neq a \\ 0, & n = a \end{cases} \quad \text{Equation 1}$$

Note that $\tau_n$ is equal to 0 for the angular position n=a because the time-domain probe measurement at angular position a is used as the center/reference frequency for cross-correlation purposes.

Time-aligned probe measurements $\overline{P}_n(t)$ are generated by applying the timing offsets $\tau_n$ derived via cross correlation of the reference measurements to the set of probe measurements as mathematically described in Equation 2 120.

$$\overline{P}_n(t) = P_n(t-\tau_n) \quad \text{Equation 2}$$

Note that $\overline{P}_n(t) = P_n(t)$ for the angular position n=a. N is the number of angular positions of the spatial sampling grid through which the positioner steps during the solid angle scan, n is an index from 1 to N, where again t represents time.

The time-aligned probe measurements $\overline{P}_n(t)$ are Fourier transformed and compared to the input signal (signal delivered to the AUT during the measurement) to derive a frequency response H(ω) of the AUT 122. The frequency response is characterized by the magnitude of the system's response, typically measured in decibels (dB) or as a decimal, and the phase, measured in radians or degrees, versus frequency in radians/sec or Hertz (Hz). Equations 3-5 mathematically describe the process of obtaining the frequency response of the AUT from the time-aligned probe measurements and the input signal (where the symbol $\Im$ represents the Fourier transform and ω represents angular frequency).

$$\Im\{I(t)\} = I(\omega) \quad \text{Equation 3}$$

$$\Im\{\overline{P}_n(t)\} = \overline{P}_n(\omega) \quad \text{Equation 4}$$

$$H_n(\omega) = \frac{\overline{P}_n(\omega)}{I(\omega)} \quad \text{Equation 5}$$

In some embodiments, when the measurements were taken/recorded (performed) in near field mode, a time-domain near-to-far-field transform to the full vector angular and temporal information of the output commutation sequence's near-field radiation pattern is applied using any time domain near-to-far-field transform (or any other known means).

In another embodiment, when the measurements (waveforms) were taken/recorded in near-field mode, holographic imagery of the radiating field at the surface of the AUT is created using the full angular and temporal information of the output commutation sequence's near-field radiation pattern using any known microwave holographic metrology means. Microwave holographic metrology involves transformation of the full angular and temporal information of the output commutation sequence's near-field radiation pattern to a representation/approximation of measurements at closer approaches to the AUT ("back-transformation"). The use of the back transformation has its greatest application in the phase alignment of phased-array antennas. The amplitude and phase of each element of a phased array can be determined accurately and is used to adjust the phase of the element, and to detect defective elements or phase shifters. Element phase accuracy of one degree RMS (root mean squared) is being achieved on large microwave radar antennas. Other uses include the detection of anomalies in radomes and in detection of surface distortion in parabolic reflector antennas.

When the measurements are not taken/recorded in near field mode, the method is complete.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A dynamic antenna pattern measurement method, said dynamic antenna pattern measurement method comprising recovering full vector angular and temporal information of an output commutation sequence's radiation by:
    placing a dynamic antenna under test (AUT) in an antenna measurement facility, said antenna measurement facility having a positioner;
    placing a reference antenna at a fixed angle with respect to said AUT;
    programming said AUT with a commutation (beamsteering) sequence to be measured;
    programming said positioner with a predetermined solid angle scan;
    transmitting said commutation sequence from said AUT with a probe antenna in an initial angular position relative to said AUT;
    recording the full time-domain waveform received by said probe antenna;
    recording the full time-domain waveform received by said reference antenna;
    moving said positioner to a next angular position in said solid angle scan;
    re-playing said AUT's commutation sequence;
    recording the full time-domain waveform received by said probe antenna;
    recording the full time-domain waveform received by said reference antenna;
    recording a plurality of full time-domain waveforms received by said probe antenna and a plurality of full time-domain waveforms received by said reference antenna by iterating through said moving said positioner to a next angular position in said predetermined solid angle scan, re-playing said AUT's commutation sequence, and recording the full time-domain waveform received by said probe antenna and the full-time domain waveform received by said reference antenna, steps until the entire predetermined solid angle scan is completed;
    designating a waveform of said plurality of full time domain waveforms received by said reference antenna to be a center reference antenna waveform;
    generating a time delay value for each angular position in said solid angle scan, wherein said time delay value for a particular angular position in said solid angle scan other than an angular position at which said center reference antenna waveform was recorded is calculated by cross correlating the full-time domain waveform received by said reference antenna at the particular angular position with said center reference antenna waveform, wherein said time delay value for the angular position at which said center reference antenna waveform was recorded is set equal to zero; and
    generating a time-aligned probe antenna full-time domain waveform for each angular position in said solid angle scan by shifting the full-time domain waveform recorded by the probe antenna at the angular position an amount equal to the time delay value generated for the angular position at which the time-aligned full-time domain waveform recorded by the probe antenna was measured.

2. The dynamic antenna pattern measurement method of claim 1 further comprising:
    applying a time-domain near-to-far-field transform to the full vector angular and temporal information of said output commutation sequence's radiation.

3. The dynamic antenna pattern measurement method of claim 1 wherein:
    said predetermined solid angle scan is spherical.

4. The dynamic antenna pattern measurement method of claim 1 wherein:
    said predetermined solid angle scan extends over a full sphere of 4 $\pi$ steradians.

5. The dynamic antenna pattern measurement method of claim 1 wherein:
    said predetermined solid angle scan is cylindrical.

6. The dynamic antenna pattern measurement method of claim 1 wherein:
    said predetermined solid angle scan is planar.

7. The dynamic antenna pattern measurement method of claim 1 wherein:
    said method is performed in near-field mode; and
    said recorded full vector angular and temporal information of said output commutation sequence's radiation pattern comprises a full angular and temporal information of the output commutation sequence's near-field radiation pattern.

8. The dynamic antenna pattern measurement method of claim 7 further comprising:
    applying a time-domain near-to-far-field transform to said full vector angular and temporal information of the output commutation sequence's near-field radiation pattern.

9. The dynamic antenna pattern measurement method of claim 7 further comprising:
    generating holographic imagery using said full vector angular and temporal information of the output commutation sequence's near-field radiation pattern.

10. The dynamic antenna pattern measurement method of claim 9 wherein said generating holographic imagery using said near-field waveform data comprises:
    back transforming said full vector angular and temporal information of the output commutation sequence's near-field radiation pattern.

* * * * *